Dec. 4, 1962 D. W. MURRAY 3,067,393

PULSE GENERATOR

Filed April 1, 1958

INVENTOR.
DONALD W. MURRAY,
BY Walter J. Adam
ATTORNEY 3,067,393
Patented Dec. 4, 1962

3,067,393
PULSE GENERATOR

Donald W. Murray, Manhattan Beach, Calif., assignor to Hughes Aircraft Company, Culver City, Calif., a corporation of Delaware Filed Apr. 1, 1958, Ser. No. 725,717
9 Claims. (Cl. 332—14)

Figures 1, 2:
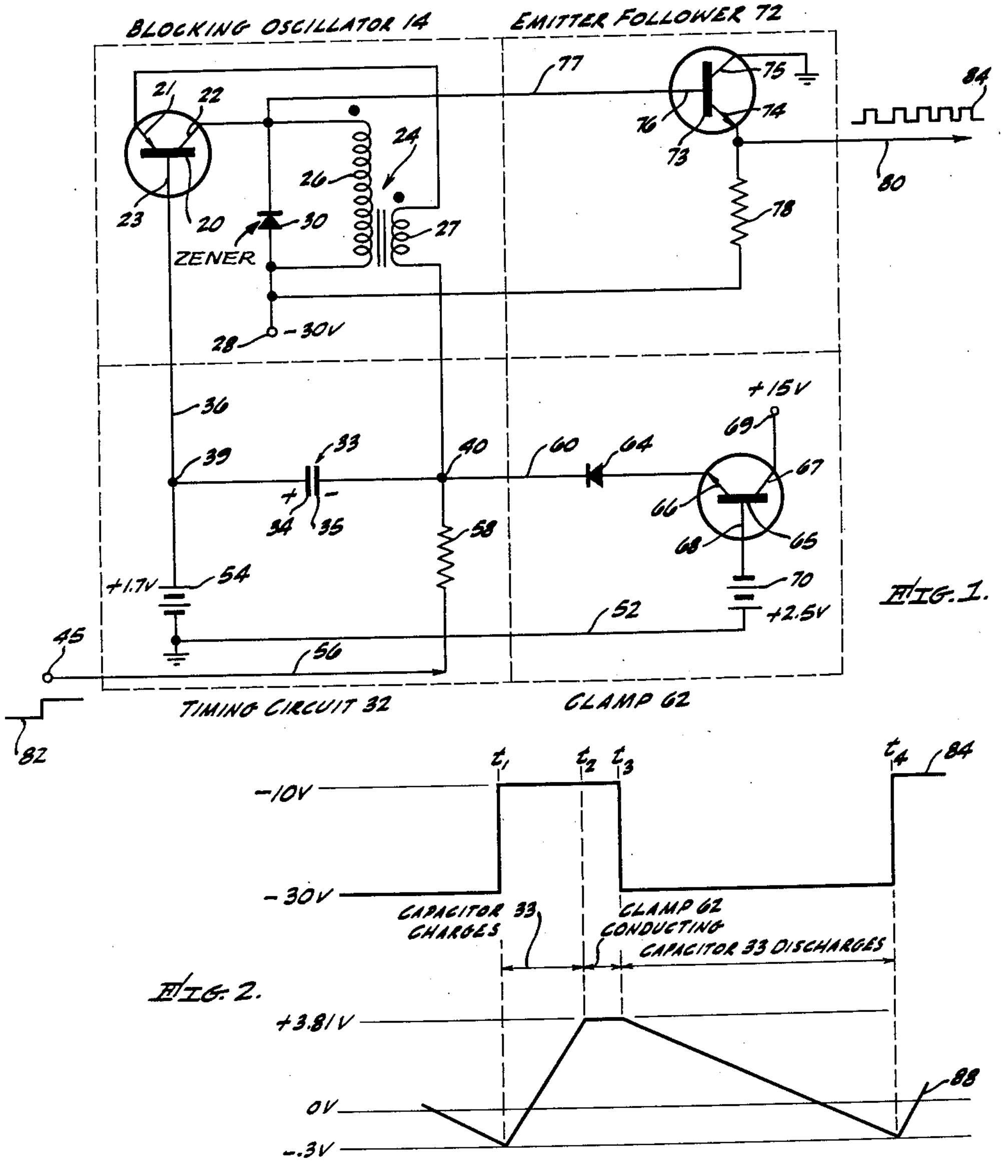

This invention relates to pulse generators and more particularly to a transistor variable rate pulse generator having a pulse rate that varies linearly with a control voltage.

Variable rate pulse generators are utilized, to generate pulse information in which the repetition rate of pulses is modulated. A special application, for example, is utilization as a "buzz" generator in equipment for the synthesization of speech, where intelligence is transmitted as trains of pulses of desired frequencies. Another application of a variable rate pulse generator is to control the repetition rate of a transmitter in a radar system. In order to be useful over a wide range of pulse repetition rates or frequencies, it is necessary that the frequency vary linearly with an impressed control voltage over the entire range. In order to obtain the required linearity, analog computer circuits have been conventionally used. These analog circuits are very complex, having a large number of components, and are expensive to build. A pulse generator which would provide linear operation with a minimum of components would be very advantageous to the art.

It is therefore an object of this invention to provide a simplified variable frequency pulse generator which has a wide frequency range and which has high degree of accuracy.

A further object of this invention is to provide a transistor pulse generator whose pulse rate is linearly dependent upon the control voltage over a wide range of pulse frequency.

Another object of this invention is to provide a blocking oscillator type pulse generator to produce variable frequencies, utilizing transistors which may be designed independent of varying characteristics of different transistors.

Another object of this invention is to provide a variable rate pulse generator which requires a minimum amount of power for operation.

According to one embodiment of this invention, a blocking oscillator including a control transistor and a transformer is provided to form output pulses upon the rise and fall of its magnetic field. The blocking oscillator is controlled by a timing circuit and a clamping circuit which determine the time between pulses in response to an input control potential. A capacitor is provided in the timing circuit, connected between the base of the control transistor at one plate of the capacitor and the emitter of the control transistor by way of one winding of the transformer at the other plate of the capacitor. A fixed potential is connected to the plate of the capacitor connected to the base, and a control potential by way of a resistor is connected at the other plate of the capacitor. During each pulse the capacitor is first charged by current passing through the capacitor and through the tarnsformer to build up a field to start the formation of the output pulse. When the capacitor is charged to a certain point, the clamping circuit is activated to prevent further charging and to supply further current to the transformer field. When the transformer field collapses at the end of the pulse the timing circuit is biased out of conduction, and the timing circuit discharges the capacitor at a rate determined by the values of the capacitor and resistor and the control potential. The capacitor discharges until the control transistor is again biased into conduction and the formation of a new pulse is started. The time between pulses has been found to vary so that the pulse frequency varies linearly with the control potential.

Figure 3:
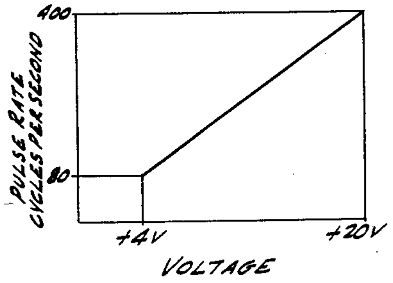

The novel features of this invention, as well as the invention itself, both as to its organization and method of operation, will best be understood from the accompanying description, taken in connection with the accompanying drawings, in which like reference numerals refer to like parts, and in which FIG. 1 is a schematic diagram of a variable rate pulse generator circuit in accordance with this invention;

FIG. 2 is a diagram of waveforms to explain the operation of this invention, and FIG. 3 is a graph to illustrate the linear operation of the pulse generator.

Referring first to FIG. 1 a schematic diagram is shown of the variable rate pulse generator of this invention. The circuit comprises a blocking oscillator circuit 14 which includes a control transistor 20 which may be of the p-n-p type, and a transformer 24. Control transistor 20 has an emitter 21, a collector 22 and a base 23. The collector 22 of the control transistor 20, which acts as a gate, is connected to the positive side of an input winding 26 of the transformer 24. The negative side of the winding 26 is connected to a −30 volt terminal 28 and to the collector of the control transistor 20 by way of a Zener diode 30, which acts to limit the negative swing across the winding 26. The emitter 21 of the control transistor 20 is connected to the positive end of an output winding 27 of the transformer 24. The polarity of windings 26 and 27 is indicated in FIG. 1. A timing circuit 32, which is provided to control the repetition rate of the blocking oscillator 14, includes a control capacitor 33 having a plate 34 and a plate 35. One plate 34 of the capacitor 33 is connected to a junction 39 which in turn is connected to the positive terminal of a +1.7 volt battery 54. The negative terminal of the battery 54 is connected to ground potential. The junction 39 is also connected to the base 23 of the control transistor 20 by a line 36. The other plate 35 of the capacitor 33 is connected to a junction 40 which in turn is connected to the negative end of the winding 27 of the transformer 24. Thus the capacitor 33 is connected across the emitter 21 and the base 23 of the control transistor 20. The junction 40 is also connected to a control line 56 by way of a resistor 58 and is connected to a clamping line 60 which passes into a clamping circuit 62. The control line 56 is also connected to input terminal 45.

The clamping circuit 62 includes a clamping transistor 65 which may be of the n-p-n type naving an emitter 66, a collector 67 and a base 68. The emitter 66 is connected to the line 60 through a diode 64. The diode 64 is connected in such a manner that current will only pass from the emitter 66 of the transistor 65 to the junction 40. The collector 67 of the transistor 65 is connected to a +15 volt terminal 69 and the base 68 is connected to the negative terminal of a +2.5 volt battery 70, the positive terminal of which is connected to ground potential by way of a line 52.

An emitter follower 72 which provides a low output impedance of the signals from the blocking oscillator 14 includes a transistor 73 which may be of the n-p-n type, having an emitter 74, a collector 75 and a base 76. The base 76 is connected through a line 77 to the collector 22 of the control transistor 20. The collector 75 of transistor 73 is connected to ground potential and the emitter 74 is connected to the —30 volt terminal 28 through a resistor 78 which acts to provide a small desired output impedance. The emitter 74 of the transistor 73 is also connected to an output line 80. It is to be noted that the transistor 73 is biased to operate as an amplifier in its unsaturated range.

In operation, a potential as indicated by one of the levels of a waveform 82 is supplied to the control line 56 at the input terminal 45 to form pulses of a desired frequency on the output line 80, as shown by a waveform 84. It is to be noted that the pulse rate of the waveform 84 varies with the change of the control potential of the waveform 82, as will be explained subsequently. At the fall of a pulse of the waveform 84, the control transistor 20 is biased out of conduction by the positive charge of the capacitor 33, as indicated, on the plate 34 which is connected to the junction 39 and to the base 23 of the transistor 20. As soon as the capacitor 33 discharges sufficiently through the resistor 58 to the terminal 45 to bias the transistor 20 back into conduction, as will be discussed, current then passes from the battery 54 through the capacitor 33 to the negative terminal of the winding 27, through the transistor 20 and through the winding 26 to the —30 volt potential at the terminal 28. The capacitor 33 is thus rapidly charged until the plate 34 connected to the junction 39 is again positive. This current passing through the winding 27 starts to build up a field in the transformer 24. The same current also passing through the control transistor 20 and through the winding 26 builds up a field in that winding in a similar phase with the field from the winding 27. Thus an output voltage pulse rapidly rises and is formed on the line 77 to cause the transistor 73 to conduct and to start formation of one of the pulses of the waveform 84 on the output line 80. The current passing through the winding 27 results in a potential difference so as to provide a positive potential on the emitter 21 of the control transistor 20. This positive potential on the emitter 21 maintains the control transistor 20 in conduction even though the plate 34 of the capacitor 33 connects to the junction 39 is now charged positively.

When the current from the battery 54 has charged the capacitor 33 so that the plate 35 connected to the junction 40 is charged to a desired negative value, the clamping transistor 65 is biased into conduction. Current then passes from the +15 volt terminal 69, through the collector 67 and the emitter 66 of the transistor 65, through the diode 64, through the winding 27, through the transistor 20 and through the winding 26 to the —30 volt terminal 28. Because the clamping transistor 65 is a low impedance source, the capacitor 33 is substantially prevented from charging any further and current is supplied from the transistor 65 to the transformer 24 to collapse the magnetic field. It is to be noted that if the capacitor 33 discharges sufficiently, the clamping transistor 65 is biased temporarily out of conduction until the capacitor 33 is recharged to cause transistor 65 to again conduct. When the field of transformer 24 collapses, the pulse of the waveform 84 falls to its lower level and is completed. It is to be noted that the pulse width is determined by the characteristics of the windings of the transformer 24. Also when the field of the transformer 24 collapse, the diode 30 acts to limit the negative swing on the line 77 to approximately —30 volts to form the desired output pulses of the waveform 84. Thus at the end of the pulse of the waveform 84, the —30 volt potential of the terminal 28 appears on the collector 22 of the transistor 20, preventing load current flow through the transistor 20. Also since there is no potential drop across the winding 27, the capacitor 33 which is connected between the emitter and base of the transistor 20 acts to bias the control transistor 20 out of conduction. Because the transistor 20 is biased out of conduction, current is prevented from passing through the clamping transistor 65. Also, because current is prevented from passing through the transistor 65, the capacitor 33 is discharged quickly as will be discussed, so that the plate 35 becomes positively charged in order to bias the transistor 65 out of conduction. At this time, after the pulse of the waveform 84 falls and the transistor 65 is biased out of conduction, the only active elements of the circuit are the capacitor 33 and the resistor 58.

The capacitor 33 which has a negative charge on the plate 35 connected to the junction 40 now discharges through the resistor 58 and through the line 56 to the terminal 45 until the transistor 20 is again biased into conduction by a charge across the capacitor 33. This discharge current flows from the terminal 45 which is positive to the negative plate 35. The R-C time constant and the potential at the terminal 45 thus determine the time until the rise of the next pulse of the waveform 84. The action of the circuit then continues again as discussed.

Referring now to FIG. 2 which is a diagram of waveforms to explain the operation of the invention, the action of this circuit will be explained in greater detail. Before time $t_1$, the output pulse of the waveform 84 is maintained at a —30 volt level from the terminal 28 while the capacitor 33 is discharging through the resistor 58. At time $t_1$, the capacitor 33, which is connected across the emitter 21 and the base 23 of the control transistor 20, is charged to a sufficient negative potential of —0.3 volt on the plate 34 connected to the junction 39, that the transistor 20 is biased into conduction. Thus a positive pulse (not shown) is formed on the line 77 to bias the emitter follower transistor 73 into conduction and form an output pulse as shown by the waveform 84. It is to be noted that the transistor 73 is biased so that the pulse of the waveform 84 rises to a high level of —10 volts. Between times $t_1$ and $t_2$ current passes from the battery 54 through the capacitor 33 through the winding 27, and through the transistor 20, charging the capacitor 33 until the potential on the plate 34 connected to the junction 39 has reached a positive voltage as shown by the waveform 88 of +3.81 volts. When the capacitor 33 has charged to this level at time $t_2$, the potential at the junction 40 is negative, and the clamping transistor 65 is biased into conduction. Thus the current from the high impedance source of the battery 54 and the capacitor 33 is substantially stopped. Between times $t_2$ and $t_3$ current is supplied to the transformer 24 from the transistor 65, and the capacitor 33 is maintained at substantially a fixed charge as shown by the waveform 88. At time $t_3$ the pulse at the collector 22 of the control transistor 20 and the output pulse of the waveform 84 falls because of the normal collapsing of the field in the transformer 24. Thus the collector 22 of the transistor 20 falls to a —30 volt potential. The potential rise across the winding 27 is eliminated so that the potential of the capacitor 33 is connected between the emitter 21 and base 23 of transistor 20. Thus the transistor 20 is biased out of conduction. At the same time the transistor 65 is biased out of conduction, as discussed.

Between times $t_3$ and $t_4$, the capacitor 33 and the resistor 58 are the only active elements in the circuit, and the capacitor 33 discharges through the resistor 58 to the terminal 45 as shown by the waveform 88. The time between times $t_3$ and $t_4$, with the fixed components shown in the circuit, is determined by the control potential of the waveform 82 at the terminal 45. It is to be noted that the R-C time constant is chosen of sufficient magnitude so that the discharge curve of the waveform 88 between times $t_3$ and $t_4$ is approximately linear.

Referring now to FIG. 3 which is a graph illustrating the linear operation of the circuit and to FIG. 1, the action of the circuit will be further explained. It has been found that between a control voltage range of +4 volts to +20 volts the pulse rate varies between 80 and 400 cycles per second in an approximately linear manner. This circuit over the range shown in FIG. 3 has been found to give a linearity within an accuracy of 1%. The circuit of this invention is designed so that a time curve versus control voltage curve of the R-C combination matches a curve of the inverse of the frequency, or time, versus control voltage. This design is accomplished by the selecting the time constant of the capacitor 33 and the resistor 58, the potential of the battery 54, the potential of the terminal 69 and the potential charge of the capacitor 33 at which the transistor 20 is biased into conduction, all to operate over a desired range of the control voltage at the terminal 45. During the time between pulses, i.e., between times $t_3$ and $t_4$, the rate at which the capacitor 33 discharges is dependent on the value of the resistor 58, the value of the capacitor 33, the battery 54, the voltage to which the capacitor 33 is charged during the pulse period as determined by the clamping circuit 62 and the control voltage impressed on the terminal 45. Thus, the circuit is designed relatively independent of varying characteristics of different transistors which may be utilized, to provide a pulse rate dependent only upon the control voltage impressed on the terminal 45. It is to be noted that by utilizing a clamping circuit 62 which has a faster response than in the embodiment shown, pulse rates up to and beyond 2000 cycles per second may be obtained, varying in a linear manner over a selected control voltage range. It has been estimated that this circuit may be designed with a clamping circuit to give an accuracy of linearity of much less than 1%.

A practical embodiment of this circuit was placed in operation in a temperature regulated oven at 75° C. to obtain the desired uniform operating characteristics from the transistors. As well known in the art, heating ovens are readily available for maintaining desired temperature conditions. It is to be noted that in accordance with known techniques, the circuit of this invention is not limited to transistors but may also utilize vacuum tubes. Since a vacuum tube circuit would be less temperature sensitive, satisfactory linear operation may be obtained without a temperature controlled oven.

Thus there has been described a variable rate pulse generator comprising a blocking oscillator which includes a control transistor and a transformer to form output pulses in response to a change of its magnetic field. A capacitor is connected across the control transistor and across one winding of the transformer, the capacitor acting to bias the transistor out of conduction between pulses. A first current source is provided to supply current to charge the capacitor to a desired level and to start the formation of a transformer field. A second source of current is provided to act as a clamping circuit to prevent the capacitor from charging above the desired level and to supply current to the transformer field to complete the output pulse. Between pulses the capacitor, a resistor and a control potential are the only active elements in the circuit, and determine the R-C discharge time. At the end of this discharge time the capacitor is discharged sufficiently to again bias the control transistor back into conduction. This simplified circuit acts to provide an output pulse rate which varies linearly with the control potential with a high degree of linearity.

What is claimed is:

1. A variable rate pulse generator for applying output pulses at varying rates of frequency to an output lead in response to a source of control potential comprising a source of potential, a transformer having a first winding with a first end coupled to said source of potential and a second end coupled to the output lead and having a second winding, gating means having a control path and having a load current path coupled between a first end of said second winding and the second end of said first winding, a capacitor having a first and a second side with said first side coupled to the control path of said gating means to bias said gating means into conduction and with said second side coupled to a second end of said second winding, a first source of current coupled to the first side of said capacitor to effectively pass current through said capacitor to said second winding, a second source of current coupled to said second side of said capacitor to supply current to said second winding, said first and second sources of current coupled together to provide a reference potential level, and a resistor coupled between said second side of said capacitor and the source of control potential.

2. A generator for forming low impedance pulses of similar width at a frequency rate varying linearly with a control signal derived from a control terminal comprising a first source of biasing potential, a transformer including a first winding having a first and second end with the first end coupled to said first source of potential and including a second winding having first and second ends, said second winding developing first pulses in response to current flow therethrough and said first winding developing a first biasing potential in response to current flow therethrough, a diode coupled between the first and second ends of said first winding, a gate having a control terminal and having a load current path coupled between the second end of said first winding and the first end of said second winding, emitter follower means coupled to the first end of said second winding to receive said first pulses and to form low impedance second pulses, a capacitor having a first and a second plate coupled respectively between said control terminal of said gate and the second end of said second winding, said capacitor forming a second biasing potential when charging, a first current source coupled to said first plate to effectively pass current through said capacitor to said second winding and through said load current path of said gate to charge said capacitor and start formation of each of said first pulses, a second diode having one end coupled to the second end of said second winding, a clamping circuit coupled to the other end of said second diode to provide a low impedance source of current to said second winding in response to said capacitor being charged to complete the formation of each of said first pulses and to shunt out the current from said capacitor, said clamping circuit being biased out of conduction by each of said first pulses being terminated to bias said gate to prevent current from passing through said second winding, said second biasing potential biasing said gate into conduction to start formation of each of said first pulses and said first biasing potential maintaining said gate biased in conduction when said capacitor is charged during the formation of each of said first pulses, and a resistor coupled between the second plate of said capacitor and the control terminal to control the discharge of said capacitor and the frequency of said second pulses.

3. A variable rate pulse generator circuit forming output pulses of a frequency that varies linearly with a control potential derived from a control terminal comprising in combination a transformer with a first and a second side, each side having first and second ends, said second side forming output pulses in response to current passing therethrough, a source of potential coupled to the first end of said first side of said transformer, a transistor having a base, an emitter and a collector with the collector coupled to the second end of said first side and the emitter coupled to the first end of said second side to receive current therefrom, a capacitor coupled between the base of said transistor and the second end of said second side, a first current source coupled to the base of said transistor to pass current to charge said capacitor and to effectively pass current through said capacitor to the second side of said transformer, a second current source coupled to the end of said capacitor coupled to the second side of said transformer to shunt out the current from said first source when said capacitor is charged and to supply current to said second side of said transformer, said first and second current source being coupled together, said second current source being biased out of conduction by the fall of the pulses developed at the first side of said transformer, and a resistor coupled between said capacitor and said source of control potential to control the discharge time of said capacitor, whereby said transistor is biased into conduction upon the discharge of said capacitor.

4. A variable frequency pulse generator for forming output pulses comprising: a transformer having a first winding and a second winding, a transistor having a base, an emitter and a collector, a first potential source, said first winding coupled between said collector and said first potential source, said emitter coupled to a first end of said second winding, a capacitor having a first and a second side coupled respectively between said base and a second end of said second winding, a second potential source coupled to said first side of said capacitor to effectively pass current through said capacitor to said second winding, clamping means coupled to a second end of said second winding, said clamping means passing current through said second winding and shunting out current from said second potential source in response to a charge on said capactor, a source of control potential, a resistor coupled between said second winding and said source of control potential to control the discharge of said capacitor, said output pulses being formed at said first winding in response to current flowing through said second winding from said capacitor and from said clamping means, said clamping means being biased out of conduction by the termination of each of said output pulses to allow said capacitor to discharge through said resistor.

5. A pulse generator comprising a blocking oscillator including a transformer having a first and a second winding and including a gate circuit having a control terminal and having load terminals coupled between first ends of said first and second windings, pulse forming means coupled to the first end of said first winding for forming output pulses in response to current flowing through said second winding, a first potential source coupled to a second end of said first winding, a timing circuit including a capacitive element having a first and a second plate coupled respectively to said control terminal of said gate circuit and to a second end of said second winding to pass current therethrough when charging, a second source of potential coupled to said first plate, discharge means coupled to said second plate to variably control the discharge time of said capacitive element, and a clamping circuit coupled to said second plate to limit the charge of said capacitive element.

6. A circuit for forming pulses comprising a capacitor having a first and a second plate, a diode coupled to said first plate, a source of clamping current coupled to said diode, a pulse forming circuit including a transformer having first and second mutually coupled windings, each winding having first and second ends, a first source of potential coupled to said first end of said first winding, a second source of potential coupled to the second plate of said capacitor, a control element having a load current path between said second end of said first winding and said first end of said second winding and having a control terminal coupled to the second plate of said capacitor, a resistor having one end coupled to the first plate of said capacitor, and a controllable source of current coupled to the other end of said resistor, said transformer and said control element forming a first portion of a pulse when said capacitor charges and current flows through said second winding therefrom and forming a second portion of the pulse when said capacitor is charged and current flows through said second winding from said source of clamping current.

7. A pulse generator responding to a source of control potential to form output pulses comprising blocking oscillator means including a transformer with first and second mutually coupled windings each having a first and a second end, first bias means coupled to the first end of said first winding, and gating means having a control terminal and having a load current path coupled between the second end of said first winding and the first end of said second winding, a capacitor having a first plate coupled to said control terminal and a second plate coupled to the second end of said second winding, said capacitor charging and supplying current to said second winding, a first current source coupled to the first plate of said capacitor, a second current source coupled to the second plate of said capacitor to supply current to said second winding, said current from said capacitor when charging and current from said second current source controlling said transformer and said gating means to form said output pulses, and a resistor coupled between the second plate of said capacitor and the source of control potential to control the discharge time of said capacitor so as to determine the time interval between said output pulses.

8. A variable rate pulse generator for forming output pulses of equal width with a frequency of occurrence varying with a control potential from a source, said generator comprising a transformer having a first winding and a second winding mutually coupled in a similar polarity to form output pulses at a first end of said second winding, a control element having a control terminal and a current path coupled to a first end of said first winding and a first end of said second winding to control current through said first and second windings, a first source of potential coupled to a second end of said second winding, a capacitor having a first side coupled to said control terminal and a second side coupled to a second end of said first winding to pass current through said first and second windings to said first source of potential to form a portion of said output pulses and to charge said capacitor when said control element is biased into conduction by said capacitor being discharged, a clamping means coupled to the second side of said capacitor to shunt out current from said capacitor and to supply current through said input and output windings when said capacitor has charged to a desired potential to form the other portions of said output pulses, and a resistor coupled between the second side of said capacitor and the source of control potential to control the discharge time of said capacitor to the source of control potential to determine the time between said output pulses.

9. A circuit for controlling a blocking oscillator to form output pulses, said blocking oscillator including a transformer having first and second mutually coupled windings each having first and second ends, a gating element having a control terminal and having a load current path coupled between the first ends of said first and second windings, a first source of potential coupled to the second end of said first winding, and diode means coupled between the first and second ends of said first winding; said circuit comprising a capacitor having a first plate coupled to said control terminal and having a second plate coupled to the second end of said second winding, a second source of potential coupled to the first plate of said capacitor, a diode having first and second ends with the first end coupled to the second plate of said capacitor, a source of clamping current coupled to the second end of said diode, a controllable source of potential, and impedance means coupled between the second plate of said capacitor and said controllable source of potential, whereby said capacitor charges with current flowing to said second winding to develop a field and form a first portion of an output pulse, and when said capacitor is charged said diode is biased into conduction and current flows from said source of clamping current to said second winding to maintain said field and complete the formation of said output pulse until said field collapses, said capacitor discharging through said impedance means to said controllable source of potential when said field collapses during a time interval controllable by varying the potential of said controllable source of potential.

References Cited in the file of this patent

UNITED STATES PATENTS

| | | |
|---|---|---|
| 2,217,401 | Geiger | Oct. 8, 1940 |
| 2,257,663 | Albrecht | Sept. 30, 1941 |
| 2,573,284 | Shaw | Oct. 30, 1951 |
| 2,577,522 | Hite et al. | Dec. 4, 1951 |
| 2,632,853 | Lindley et al. | Mar. 24, 1953 |
| 2,713,638 | Whitaker | July 16, 1955 |
| 2,925,492 | Myers et al. | Feb. 16, 1960 |